United States Patent
Huang et al.

(10) Patent No.: US 7,298,186 B2
(45) Date of Patent: Nov. 20, 2007

(54) CONTROL CIRCUIT FOR COMMAND SIGNALS OF CLOCK GENERATOR

(75) Inventors: Yong-Zhao Huang, Shenzhen (CN); Wu Jiang, Shenzhen (CN); Yun Li, Shenzhen (CN); Yong-Xing You, Shenzhen (CN)

(73) Assignees: Hong Fu Jin Precision Industry (Shen Zhen) Co., Ltd., Shenzhen, Guangdong Province (CN); Hon Hai Precision Industry Co., Ltd., Tu-Cheng, Teipei Hsien (TW)

( * ) Notice: Subject to any disclaimer, the term of this patent is extended or adjusted under 35 U.S.C. 154(b) by 160 days.

(21) Appl. No.: 11/306,922

(22) Filed: Jan. 17, 2006

(65) Prior Publication Data
US 2006/0232324 A1    Oct. 19, 2006

(30) Foreign Application Priority Data
Apr. 15, 2005    (CN) .................... 2005 1 0034292

(51) Int. Cl.
*H03L 7/00* (2006.01)
(52) U.S. Cl. ...................................... 327/143; 327/292
(58) Field of Classification Search ................ 327/142, 327/143, 198, 292, 319, 320, 333, 493, 504, 327/583
See application file for complete search history.

(56) References Cited

U.S. PATENT DOCUMENTS

| | | | |
|---|---|---|---|
| 5,319,255 A * | 6/1994 | Garverick et al. | 327/143 |
| 5,349,244 A * | 9/1994 | Confalonieri | 327/143 |
| 6,304,114 B1 * | 10/2001 | Hirakawa | 327/143 |
| 6,335,646 B1 * | 1/2002 | Nagatomo | 327/143 |
| 6,496,071 B1 | 12/2002 | Xavier | |
| 6,650,154 B2 * | 11/2003 | Okuyama | 327/143 |
| 6,781,431 B2 | 8/2004 | Taito et al. | |

* cited by examiner

*Primary Examiner*—Jeffrey Zweizig
(74) *Attorney, Agent, or Firm*—Winston Hsu

(57) ABSTRACT

A control circuit for command signals of a clock generator includes a power supply end, an output end, a control end, a diode, a first resistor and a second resistor. The first resistor, the diode, and the second resistor are connected in series between the power supply end and the ground. The diode has an anode connected to the first resistor and a cathode connected to the second resistor. The control end is connected to a node between the diode and the second resistor; the output end is connected to a node between the diode and the first resistor. The output end outputs the command signals to the clock generator.

4 Claims, 3 Drawing Sheets

CONTROL CIRCUIT FOR COMMAND SIGNALS OF CLOCK GENERATOR

FIELD OF THE INVENTION

The present invention relates in general to a control circuit of command signals, and more particular to a control circuit of command signals of a clock generator.

DESCRIPTION OF RELATED ART

A clock generator mounted on a motherboard of a computer is used to determine the CPU, PCI, and system bus speeds. The clock generator is controlled by command signals from a control circuit. If all of the voltages at the planar connector from the power supply are within a predetermined tolerance level, i.e. within specification, the power good (PG) signal goes high thereby causing the clock generator to generate clock signals to a computer system.

FIG. 3 illustrates a conventional control circuit for command signals of a clock generator. The control circuit includes two transistors Q1 and Q2. A base of the transistor Q1 is connected via a resistor R3 to a control end Vccp, a collector of the transistor Q1 is coupled to a power supply end Vdc via a resistor R1, the collector of the transistor Q1 is also coupled to a base of the transistor Q2. A collector of the transistor Q2 is connected to the power supply end Vdc via a resistor R2. Emitters of the two transistors Q1 and Q2 are grounded. The collector of the transistor Q2 is connected to an output end VTT_PWRGD via a resistor R4. The output end VTT_PWRGD outputs the command signal PG to a clock generator. The voltage of the power supply end Vdc is provided by the motherboard and the value is 3.3V. When the voltage of the control end Vccp is at a high level, the transistor Q1 is turned on, the transistor Q2 is turned off, the voltage at the output end VTT_PWRGD is at a high level to enable the clock generator to generate clock signals; when the voltage of the control end Vccp is at a low level, the transistor Q1 is turned off, the transistor Q2 is turned on, the voltage at the output end VTT_PWRGD is at a low level, the clock generator does not generate clock signals. However, employing the two transistors to control the command signals of the clock generator increases the cost of the manufacture of the motherboard.

What is needed, therefore, is a control circuit for command signal of clock generator which not only accomplishes the same efficiency of the prior art, but also can be mass produced at a reasonable cost.

SUMMARY OF INVENTION

An exemplary control circuit for command signals of a clock generator includes a power supply end, an output end, a control end, a diode, a first resistor and a second resistor. The first resistor, the diode, and the second resistor are connected in series between the power supply end and the ground. The diode has an anode connected to the first resistor and a cathode connected to the second resistor. The control end is connected to a node between the diode and the second resistor; the output end is connected to a node between the diode and the first resistor. The output end outputs the command signals to the clock generator.

It is of advantage that employing a diode as a switch to replace the two transistors of the prior art can be mass produced at a reasonable cost.

Other advantages and novel features will become more apparent from the following detailed description of preferred embodiments when taken in conjunction with the accompanying drawings, in which:

DETAILED DESCRIPTION

Figure 1:
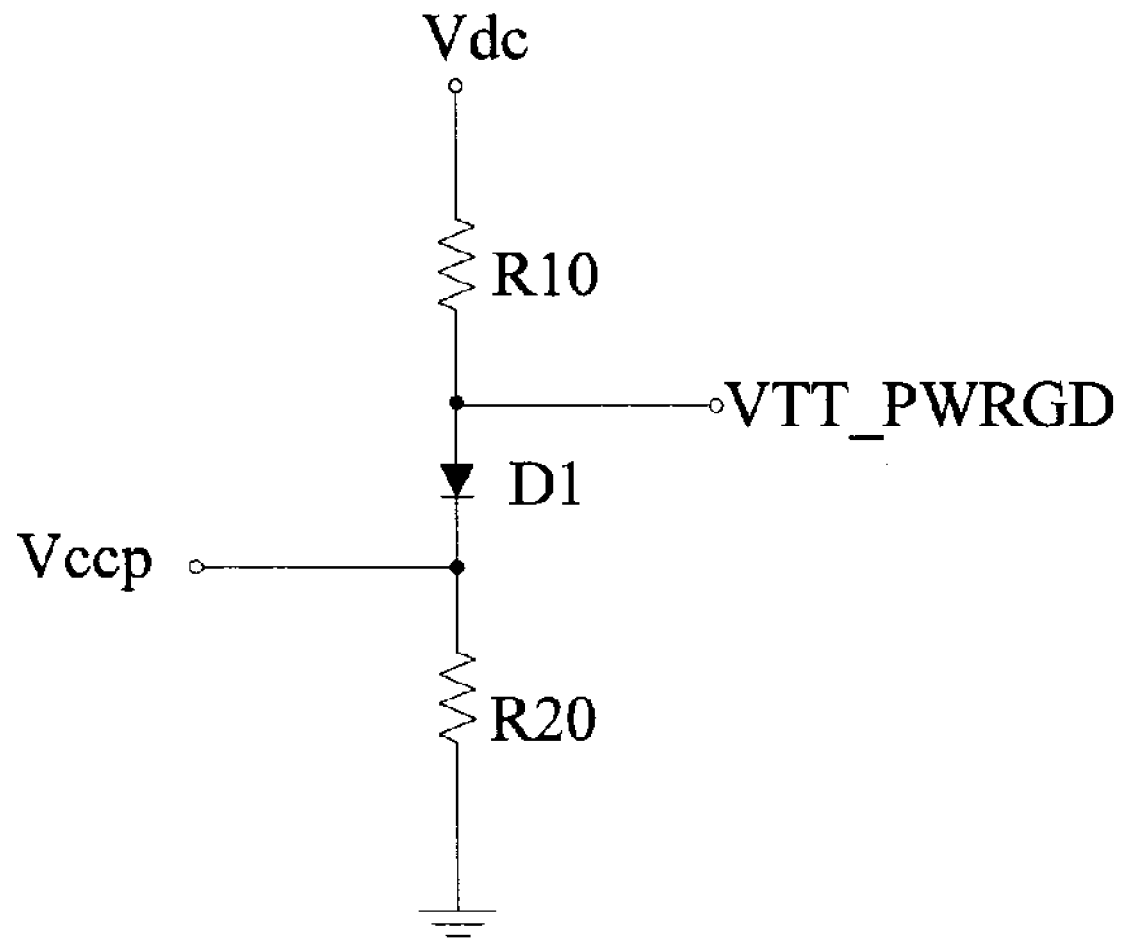
FIG. 1 is a circuit diagram of a control circuit for command signals in accordance with a preferred embodiment of the present invention.

Referring to FIG. 1, a control circuit for command signals of a clock generator includes a diode D1, a first resistor R10, a second resistor R20, a control end Vccp, a power supply end Vdc, and an output end VTT_PWRGD. The first resistor R1, the diode D1, and the second resistor R2 are connected in series between the power supply end Vdc and the ground. An anode of the diode D1 is connected to the first resistor R1, and a cathode of the diode D1 is connected to the second resistor R20. The control end Vccp is connected at a node between the diode D1 and the second resistor R20. The output end VTT_PWRGD is connected to a node between the first resistor R10 and the diode D1. A voltage of the power supply end Vdc is 3.3V.

When the voltage of the control end Vccp is at a high level, the diode D1 is turned off, the voltage at the output end VTT_PWRGD is at a high level to enable the clock generator to generate clock signals; when the voltage of the control end Vccp is at a low level, the diode D1 is turned on, the voltage at the output end VTT_PWRGD is at a low level, the clock generator does not generate clock signals.

Figure 2:
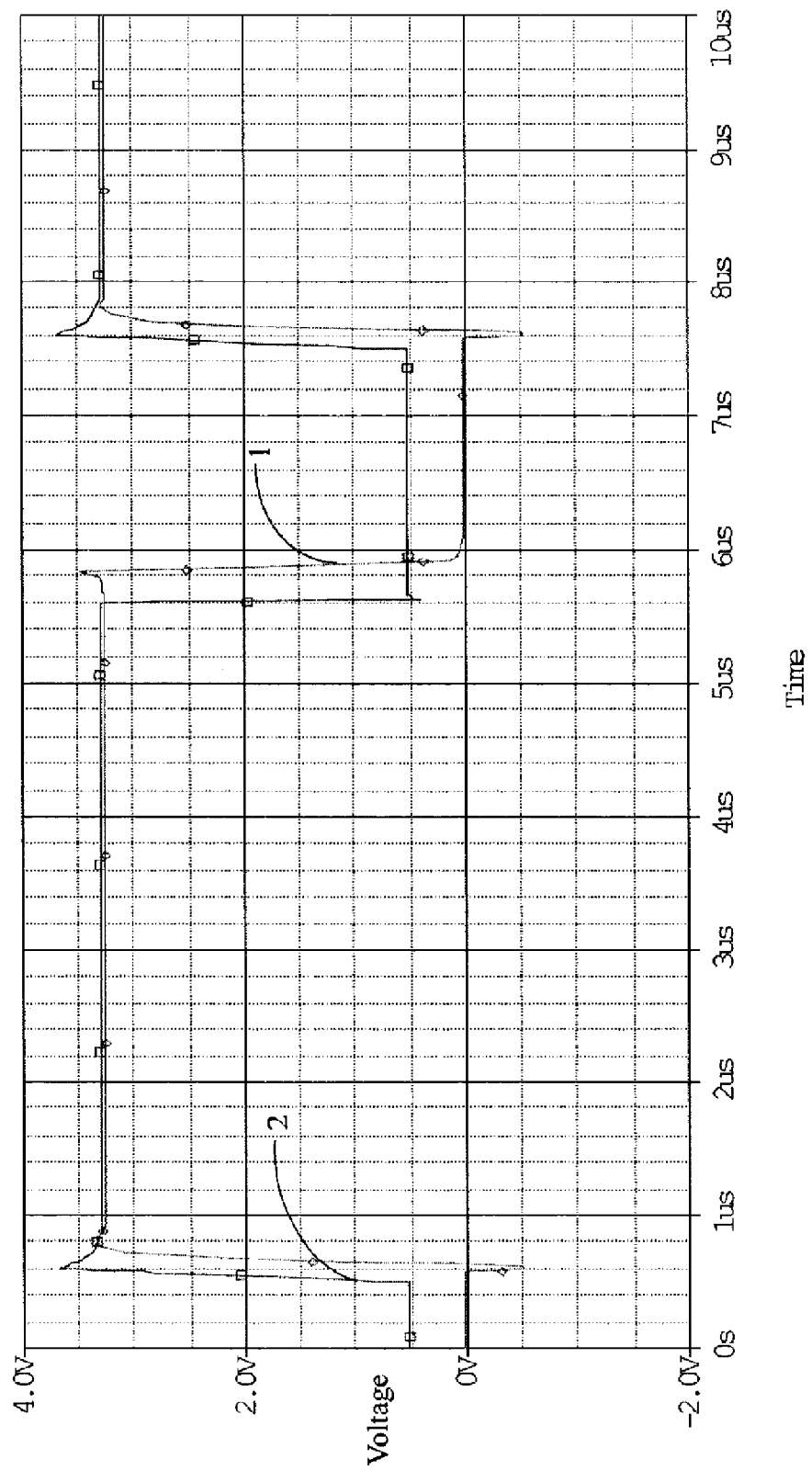
FIG. 2 is a comparative graph showing signal waveforms obtained using the circuits of FIG. 1 and FIG. 3.
Figure 3:
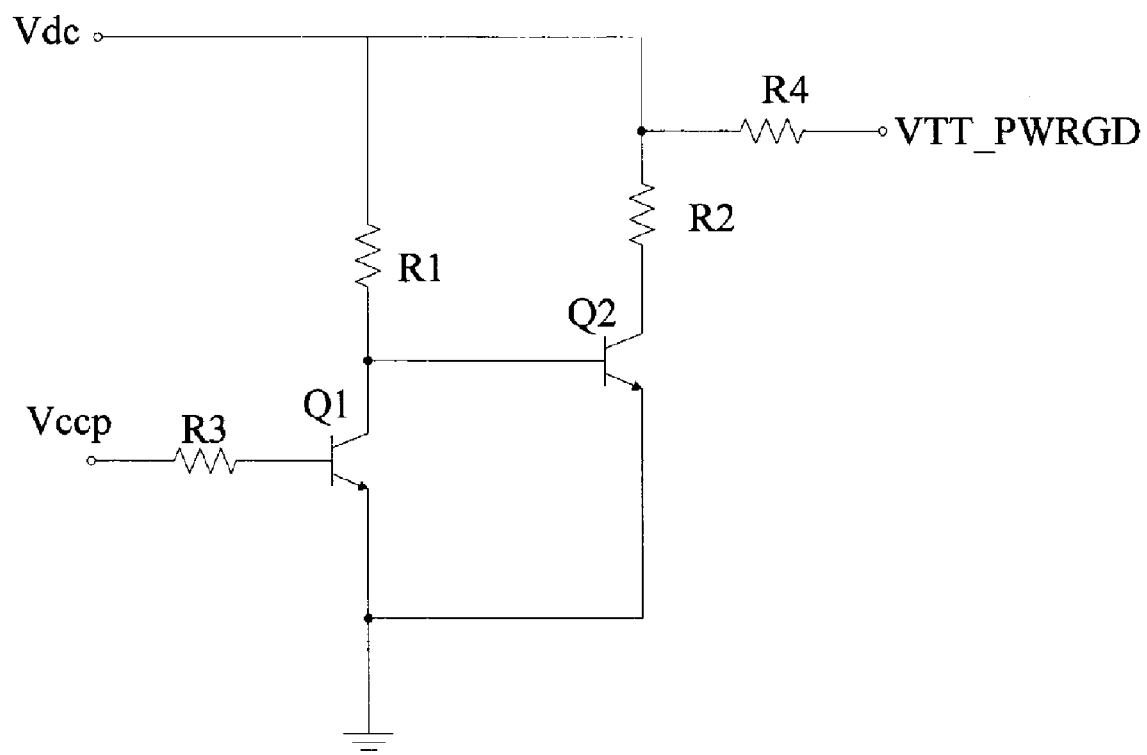
FIG. 3 is a circuit diagram of a conventional control circuit for command signals of a clock generator.

FIG. 2 is a comparative graph showing signal waveforms obtained using the circuits of FIG. 1 and FIG. 3. Line 1 denotes the signal waveform obtained using the circuit of FIG. 3, and line 2 denotes the signal waveform obtained using the circuit of FIG. 1. As shown in FIG. 2, employing the control circuit for command signals of the clock generator of the present invention accomplishes the same efficiency of the FIG. 3. The embodiment of the invention only uses a diode D1 as a switch to control the voltage at the output end VTT_PWRGD to save the cost of the manufacture of the motherboard.

It is to be understood, however, that even though numerous characteristics and advantages of the present embodiment has been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A control circuit for command signals of a clock generator comprising a power supply end, an output end, and a control end; a diode, a first resistor and a second resistor connected in series between the power supply end and the ground, the control end connected to a node between the diode and the second resistor, the output end connected to a node between the diode and the first resistor, wherein the output end outputs the command signals to the clock generator.

2. The control circuit as claimed in claim 1, wherein the diode has an anode connected to the first resistor and a cathode connected to the second resistor.

3. The control circuit as claimed in claim 2, wherein the power supply end has a voltage of 3.3V.

4. A control circuit for command signals of a clock generator comprising a power supply end, an output end, a control end, a first resistor, a second resistor, and a switch, the first resistor, the second resistor and the switch connected in series between the power supply end and the ground, the control end connected to a node between the diode and the second resistor, the output end connected to a node between the diode and the first resistor, wherein the output end outputs the command signals to the clock generator, when the voltage at the control end is at a high level, the switch is turned off to output a high voltage at the voltage output end, when the voltage at the control end is at a low level, the switch turned on to output a low voltage at the voltage output end.

* * * * *